United States Patent
Chi et al.

(10) Patent No.: US 9,543,198 B2
(45) Date of Patent: Jan. 10, 2017

(54) STRUCTURE AND METHOD FOR FORMING INTERCONNECT STRUCTURE

(71) Applicant: Taiwan Semiconductor Manufacturing Company, Ltd., Hsin-Chu (TW)

(72) Inventors: Chih-Chien Chi, Hsin-Chu (TW);
Huang-Yi Huang, Hsin-Chu (TW);
Szu-Ping Tung, Taipei (TW);
Ching-Hua Hsieh, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/593,363

(22) Filed: Jan. 9, 2015

(65) Prior Publication Data
US 2015/0123279 A1   May 7, 2015

Related U.S. Application Data

(62) Division of application No. 14/015,826, filed on Aug. 30, 2013, now Pat. No. 8,940,635.

(51) Int. Cl.
*H01L 21/768*  (2006.01)
*H01L 23/522*  (2006.01)
(Continued)

(52) U.S. Cl.
CPC ..... *H01L 21/76847* (2013.01); *H01L 21/7684* (2013.01); *H01L 21/76838* (2013.01); *H01L 21/76841* (2013.01); *H01L 21/76846* (2013.01); *H01L 21/76849* (2013.01); *H01L 21/76877* (2013.01); *H01L 23/481* (2013.01);
(Continued)

(58) Field of Classification Search
CPC ............. H01L 21/768; H01L 21/76838; H01L 21/7684; H01L 21/76841; H01L 21/76846; H01L 21/76847; H01L 23/52; H01L 23/5226; H01L 23/528; H01L 23/5283
See application file for complete search history.

(56) References Cited

U.S. PATENT DOCUMENTS

| | | | |
|---|---|---|---|
| 5,837,618 A | 11/1998 | Avanzino et al. | |
| 6,184,130 B1 * | 2/2001 | Ku | H01L 21/76843 257/E21.584 |

(Continued)

FOREIGN PATENT DOCUMENTS

WO    WO 2005/038904    *   4/2005

*Primary Examiner* — Eduardo A Rodela
(74) *Attorney, Agent, or Firm* — Slater Matsil, LLP

(57) ABSTRACT

A method for forming a semiconductor structure includes providing a semiconductor substrate and forming a dielectric layer over the semiconductor substrate. An opening is formed in the dielectric layer. A conductive line is formed in the opening, wherein the conductive line has an open void formed therein. A sealing metal layer is formed overlying the conductive line, the dielectric layer, and the open void, wherein the sealing metal layer substantially fills the open void. The sealing metal layer is planarized so that a top surface thereof is substantially level with a top surface of the conductive line. An interconnect feature is formed above the semiconductor substrate, wherein the interconnect feature is electrically coupled with the conductive line and the sealing metal layer-filled open void.

20 Claims, 5 Drawing Sheets

(51) Int. Cl.
*H01L 23/532* (2006.01)
*H01L 23/48* (2006.01)
*H01L 23/482* (2006.01)

(52) U.S. Cl.
CPC ...... *H01L 23/4827* (2013.01); *H01L 23/5226* (2013.01); *H01L 23/53223* (2013.01); *H01L 23/53238* (2013.01); *H01L 23/53252* (2013.01); *H01L 23/53266* (2013.01); *H01L 23/53295* (2013.01); *H01L 2924/0002* (2013.01)

(56) References Cited

U.S. PATENT DOCUMENTS

| | | | |
|---|---|---|---|
| 6,465,345 B1 * | 10/2002 | Nogami | H01L 21/3212 257/303 |
| 6,503,827 B1 * | 1/2003 | Bombardier | H01L 21/76834 257/E21.583 |
| 6,600,228 B2 | 7/2003 | Lee et al. | |
| 7,863,180 B2 | 1/2011 | Cooney, III et al. | |
| 2002/0072223 A1 | 6/2002 | Gilbert et al. | |
| 2004/0048468 A1 * | 3/2004 | Liu | H01L 21/76805 438/687 |
| 2005/0023701 A1 * | 2/2005 | Kajita | H01L 21/76843 257/774 |
| 2006/0202345 A1 * | 9/2006 | Barth | H01L 21/76843 257/761 |
| 2007/0155165 A1 | 7/2007 | Park et al. | |
| 2014/0252616 A1 * | 9/2014 | Lin | H01L 23/48 257/751 |

* cited by examiner

STRUCTURE AND METHOD FOR FORMING INTERCONNECT STRUCTURE

PRIORITY CLAIM

This application claims priority to and is a divisional of U.S. patent Ser. No. 14/015,826, filed Aug. 30, 2013, and entitled "Structure and Method for Forming Interconnect Structure," which application is incorporated herein by reference.

BACKGROUND

In semiconductor technology, an integrated circuit pattern can be formed on a substrate using various processes including a photolithography process, ion implantation, deposition and etch. Damascene processes are utilized to form multi-layer copper interconnections including vertical interconnection vias and horizontal interconnection metal lines. During a damascene process, trenches are formed in a dielectric material layer, metal such as copper or tungsten is filled in the trenches, then a chemical mechanical polishing (CMP) process is applied to remove excess metal on the dielectric material layer and planarize the top surface.

As the integrated circuit (IC) fabrication moves to advanced technology nodes, the IC feature size scales down to smaller dimensions. For example, the trench dimensions get smaller and smaller and as a result filling the metal layer in the trench becomes increasingly difficult. Oftentimes, a void, seam, or pit is formed after the metal layer is deposited. The poor step coverage of the barrier/adhesion layer and the metal layer, the small feature size of the trench opening, and the high aspect ratio of the opening all can contribute to the formation of voids. Voids in the metal film can trap impurities inside and can be opened up during the planarization process after the metal film deposition. A buried void or a void that is opened can degrade device yield and cause reliability problems, such as delamination and electro-migration during reliability testing. Moreover, a subsequent interconnect feature, such as a metal line that lands on and makes electrical contact with the underlying metal film having a void therein can degrade device performance and cause reliability problems.

Accordingly, a structure and method for forming an interconnect structure are needed to address the above issues.

BRIEF DESCRIPTION OF DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

In the following description, specific details are set forth to provide a thorough understanding of embodiments of the present disclosure. However, one having ordinary skill in the art will recognize that embodiments of the disclosure can be practiced without these specific details. In some instances, well-known structures and processes are not described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are intended for illustration.

Figure 1:
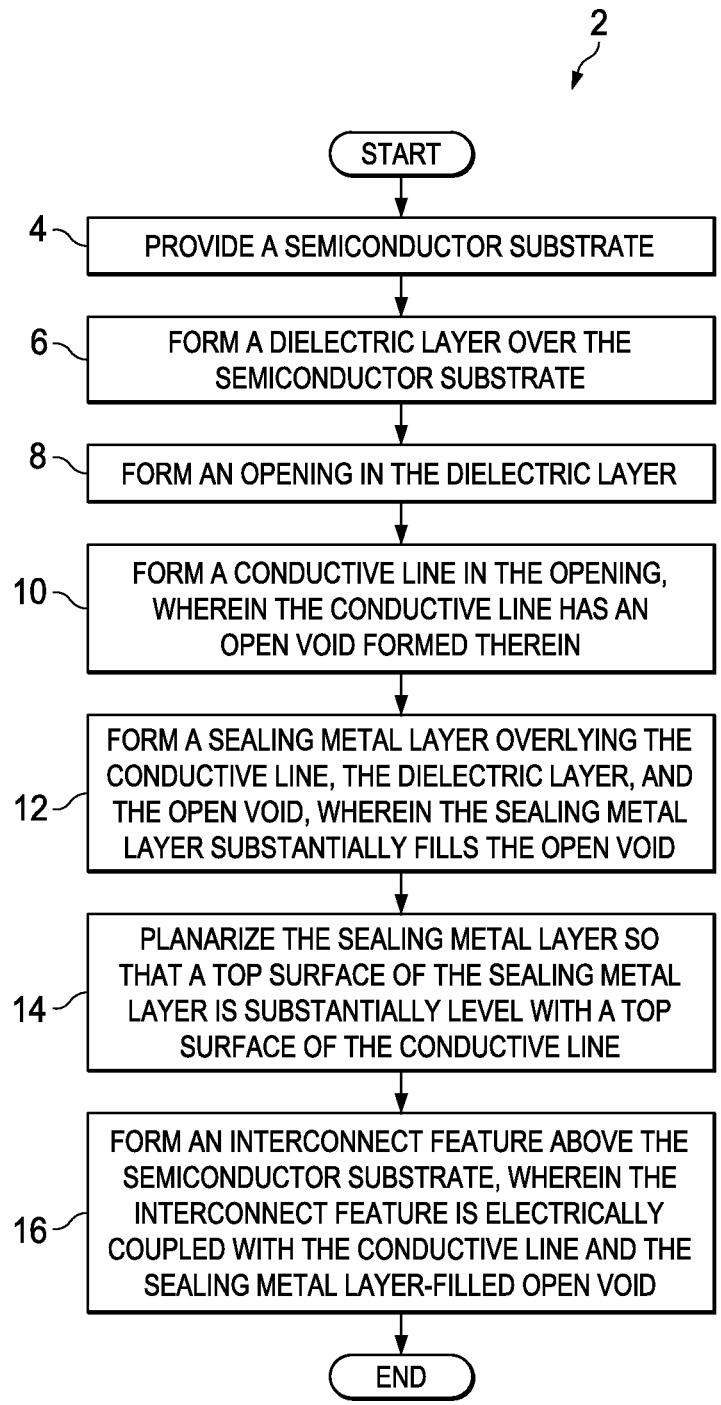
FIG. 1 is a flowchart of a method of fabricating a semiconductor device having an interconnect structure according to various embodiments of the present disclosure.

FIG. 1 is a flowchart of a method 2 for fabricating a semiconductor device having an interconnect structure according to various aspects of the present disclosure. Referring to FIG. 1, the method 2 includes block 4, in which a semiconductor substrate is provided. The method 2 includes block 6, in which a dielectric layer is formed on the semiconductor substrate. The method 2 includes block 8, in which an opening is formed in the dielectric layer. The method 2 includes block 10, in which a conductive line is formed in the opening. The conductive line has an open void formed therein. The method 2 includes block 12, in which a sealing metal layer is formed overlying the conductive line, the dielectric layer, and the open void. The sealing metal layer substantially fills the open void. The method 2 includes block 14, in which the sealing metal layer is planarized so that a top surface thereof is substantially level with a top surface of the conductive line. The method 2 includes block 16, in which an interconnect feature is formed above the semiconductor substrate. The interconnect feature is electrically coupled with the conductive line and the sealing metal layer-filled open void.

It is understood that additional processes may be performed before, during, or after the blocks 4-16 shown in FIG. 1 to complete the fabrication of the semiconductor device, but these additional processes are not discussed herein in detail for the sake of simplicity.

FIGS. 2-7b are diagrammatic fragmentary cross-sectional side views of a semiconductor device at various fabrication stages according to embodiments of the method 2 of FIG. 1. It is understood that FIGS. 2-7b have been simplified for a better understanding of the inventive concepts of the present disclosure. It should be appreciated that the materials, geometries, dimensions, structures, and process parameters described herein are exemplary only, and are not intended to be, and should not be construed to be, limiting to the invention claimed herein. Many alternatives and modifications will be apparent to those skilled in the art, once informed by the present disclosure.

FIGS. 2-6b are cross-sectional views of an interconnect structure on a semiconductor device, according to one embodiment of the present disclosure.

Figure 2:
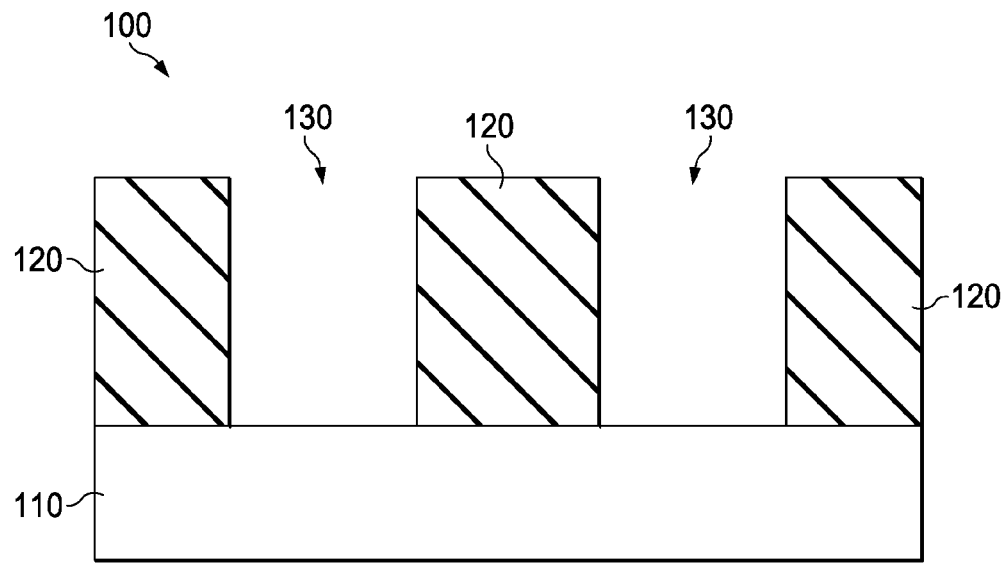
FIGS. 2-5 and 6a-6b are cross-sectional views of a portion of an interconnect structure on a semiconductor device at various stages of fabrication, according to one embodiment of the present disclosure.

Referring now to FIG. 2, a semiconductor device 100 is provided. The semiconductor structure 100 includes a substrate 110 and a first dielectric layer 120 having openings 130 therein. The substrate 110 may include silicon or other elementary semiconductors such as germanium. The substrate 110 may be a single crystalline or a compound semiconductor substrate. The substrate 110 can contain features and device regions. For example, underneath openings 130, there can be a contact or a metal structure that provides electrical connection to device regions in the substrate 110 (not shown).

Openings 130 may be trenches for forming metal lines. Alternatively, openings 130 can be vias (holes), contacts (holes) or other patterns into which a conductive layer is to be formed. In an exemplary embodiment, first dielectric layer 120 has a low dielectric constant (k value), preferably lower than about 3.0. More preferably, first dielectric layer 120 has a k value of less than about 2.5. First dielectric layer 120 may include commonly used materials such as carbon-containing dielectric materials, and may further contain nitrogen, hydrogen, oxygen, and combinations thereof. A porous structure is preferred for lowering the k value. The preferred thickness of first dielectric layer 120 is between about 1,000 Angstroms and about 3,500 Angstroms. One skilled in the art will realize, however, that the dimensions recited throughout the description are related to the technology used for forming the integrated circuits, and will reduce with the change of the formation technology.

Openings 130 may be formed by photolithography techniques known in the art. Generally, photolithography techniques involve applying a photoresist material (not shown) and exposing the photoresist material in accordance with a desired pattern. The photoresist material is then developed to remove a portion of the photoresist material, thereby exposing the underlying material in accordance with the desired pattern. The remaining photoresist material protects the underlying material from subsequent processing steps, such as etching, performed to form the openings 130 in the first dielectric layer 120. The etching process may be a wet or dry, anisotropic or isotropic, etch process. After the openings 130 are formed in the first dielectric layer 120, the remaining photoresist, if any, may be removed. Other processes, such as electron beam lithography (EBL) or the like, may be utilized to form openings 130.

It should be noted that the process discussed above described a single-damascene process for illustrative purposes only. Other processes, such as a dual-damascene process may be utilized in accordance with an embodiment of the present invention. For example, a dual-damascene process may be utilized to form a trench and a via through one or more layers of the first dielectric layer 120.

Figure 3:
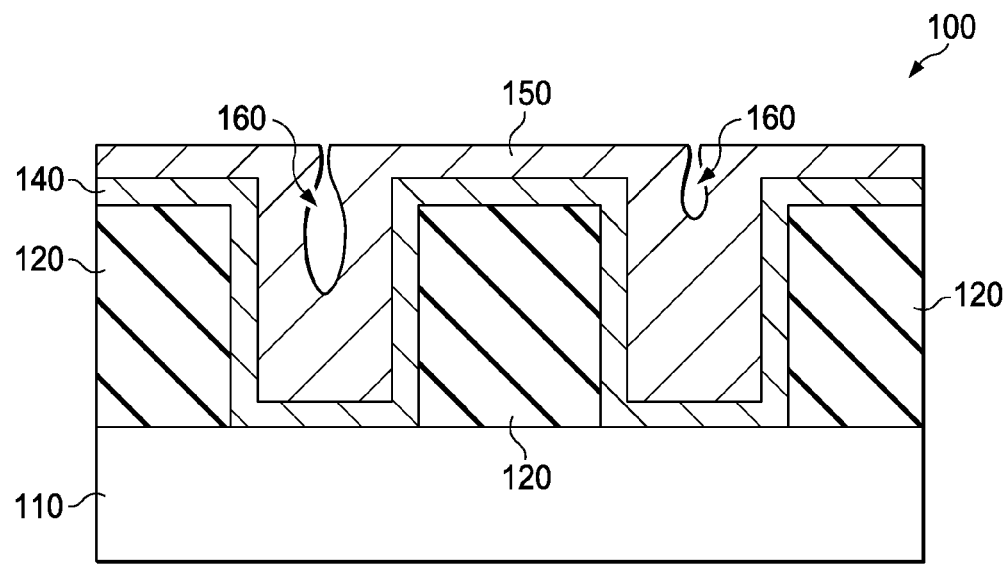

FIG. 3 illustrates the formation of first diffusion barrier layer 140 and conductive material layer 150 in openings 130. The first diffusion barrier layer 140 provides an effective prevention from metal diffusion into the first dielectric layer 120. First diffusion barrier layer 140 is blanket deposited over substrate 110 using physical vapor deposition (PVD) or one of the chemical vapor deposition (CVD) methods to line openings 130. First diffusion barrier layer 140 preferably includes titanium, titanium nitride, tantalum, tantalum nitride, cobalt, or other alternatives. The thickness of first diffusion barrier layer 140 may be between about 20 Angstroms and about 200 Angstroms.

After the first diffusion barrier layer 140 is deposited, conductive material layer 150 is deposited over substrate 110. Conductive material layer 150 may include copper, copper alloys, aluminum, aluminum alloys, tungsten, silver, gold, combinations of these, or other conductive materials. Some exemplary processes usable to deposit conductive material layer 150 may include chemical vapor deposition (CVD), plasma-enhanced chemical vapor deposition (PECVD), electroplating, electroless deposition, or other suitable methods.

A void 160 is often formed after the conductive material layer 150 is deposited. The poor step coverage of the first diffusion barrier layer 140 and the conductive material layer 150, the small feature size of openings 130, and the high aspect ratio of openings 130 all can contribute to the formation of void 160. Void 160 can form anywhere in opening 130. For example, void 160 can form at or near the center of opening 130, near a top or a bottom of opening 130, or near a sidewall of first diffusion barrier layer 140.

Figure 4:
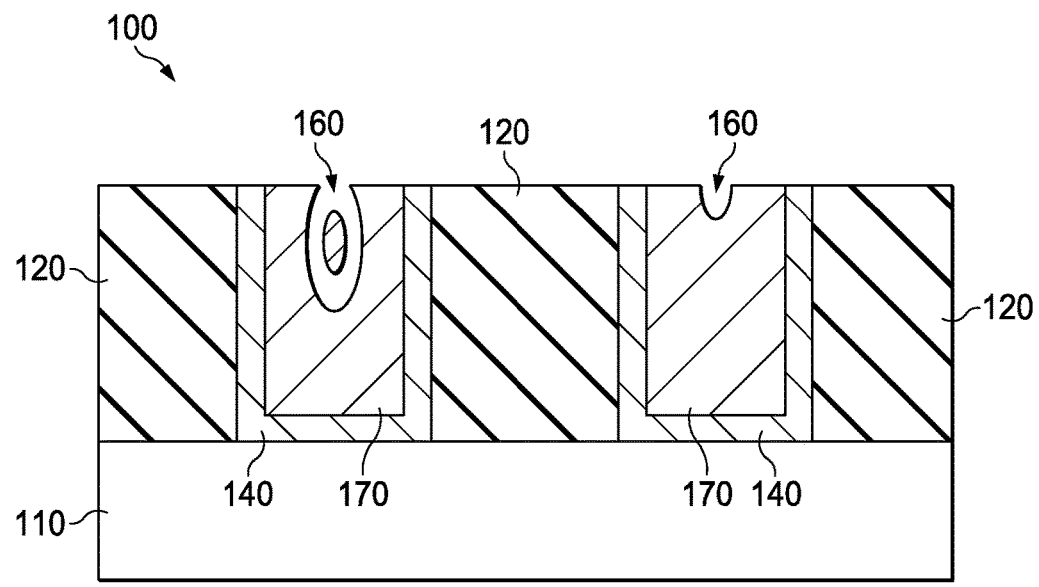

As shown in FIG. 4, a chemical mechanical polish (CMP) is then performed to remove excess conductive material on first dielectric layer 120, so that a top surface of conductive material layer 150 is substantially level with a top surface of first dielectric layer 120 leaving first diffusion barrier layer 140 and first conductive lines 170 only in openings 130. The planarization step also opens up void 160.

An optional pretreatment may be performed to treat the surface of first conductive lines 170. The pretreatment has the function of removing impurities along the surface of the first conductive lines 170 and/or reducing native copper oxide to copper.

Figure 5:
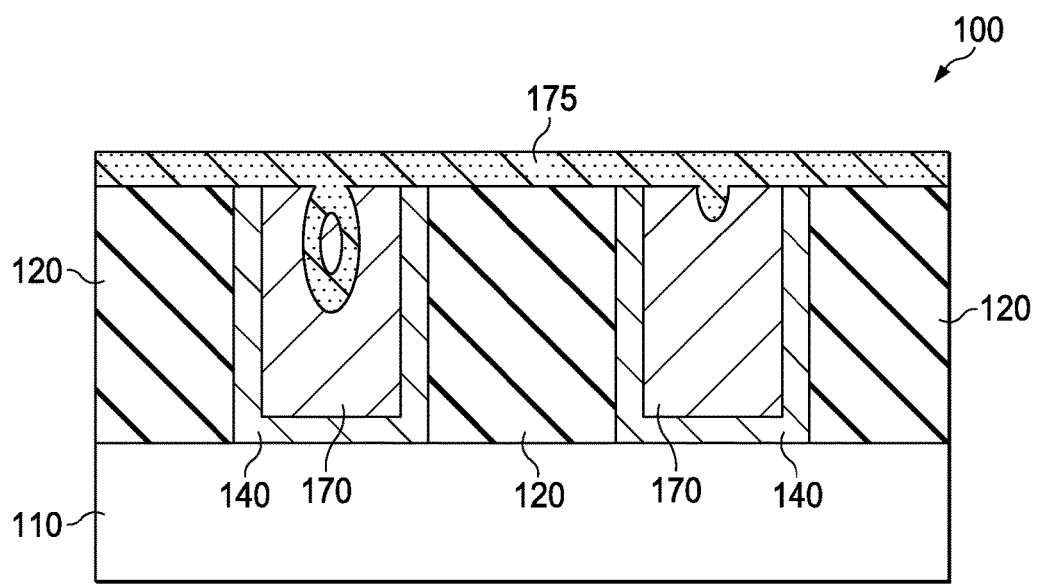

Referring now to FIG. 5, a sealing metal layer 175 is deposited over the first conductive lines 170, portions of the first diffusion barrier layer 140, the first dielectric layer 120, and the open voids 160. The sealing metal layer 175 is a conductive material that substantially fills and seals the open voids 160. By eliminating buried voids or voids that are opened in first conductive lines 170, the sealing metal layer 175 provides a reliable interconnection between first conductive lines 170 and an interconnect feature, such as a metal line that lands on and makes electrical contact with first conductive line 170.

The sealing metal layer 175 is formed by one of chemical vapor deposition (CVD), physical vapor deposition (PVD), plasma-enhanced chemical vapor deposition (PECVD), metal-organic chemical vapor deposition (MOCVD), atomic layer deposition (ALD), plasma-enhanced atomic layer deposition (PEALD), or any other suitable deposition processes. A material of the sealing metal layer 175 may include cobalt (Co), cupper (Cu), tungsten (W), aluminum (Al), manganese (Mn), ruthenium (Ru), and their combinations. In another embodiment, a material of the sealing metal layer 175 includes oxides, nitrides, and their combinations.

Figure 6A:
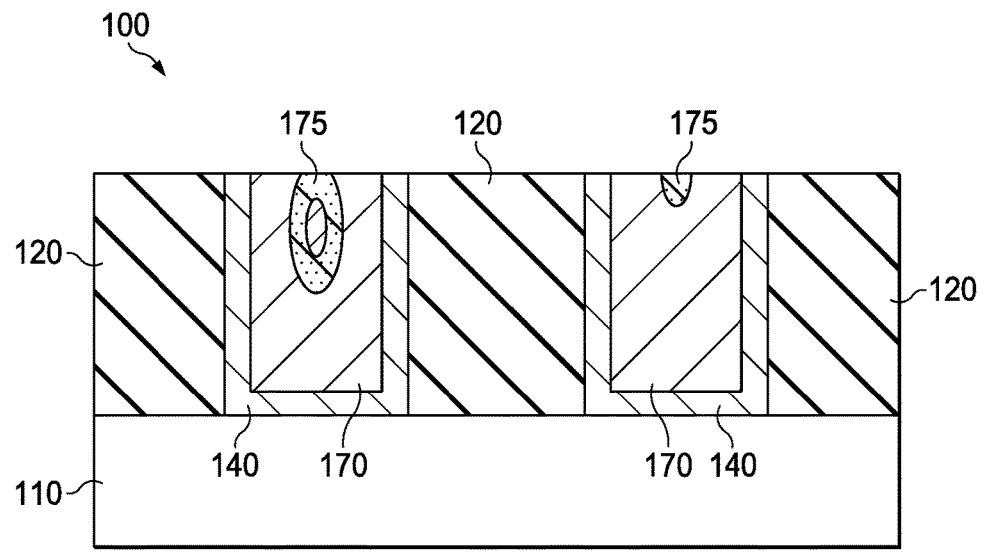

As shown in FIG. 6a, a chemical mechanical polish step is then performed to remove excess sealing metal layer 175 so that a top surface of the sealing metal layer 175 is substantially level with a top surface of the first conductive line 170.

Figure 6B:
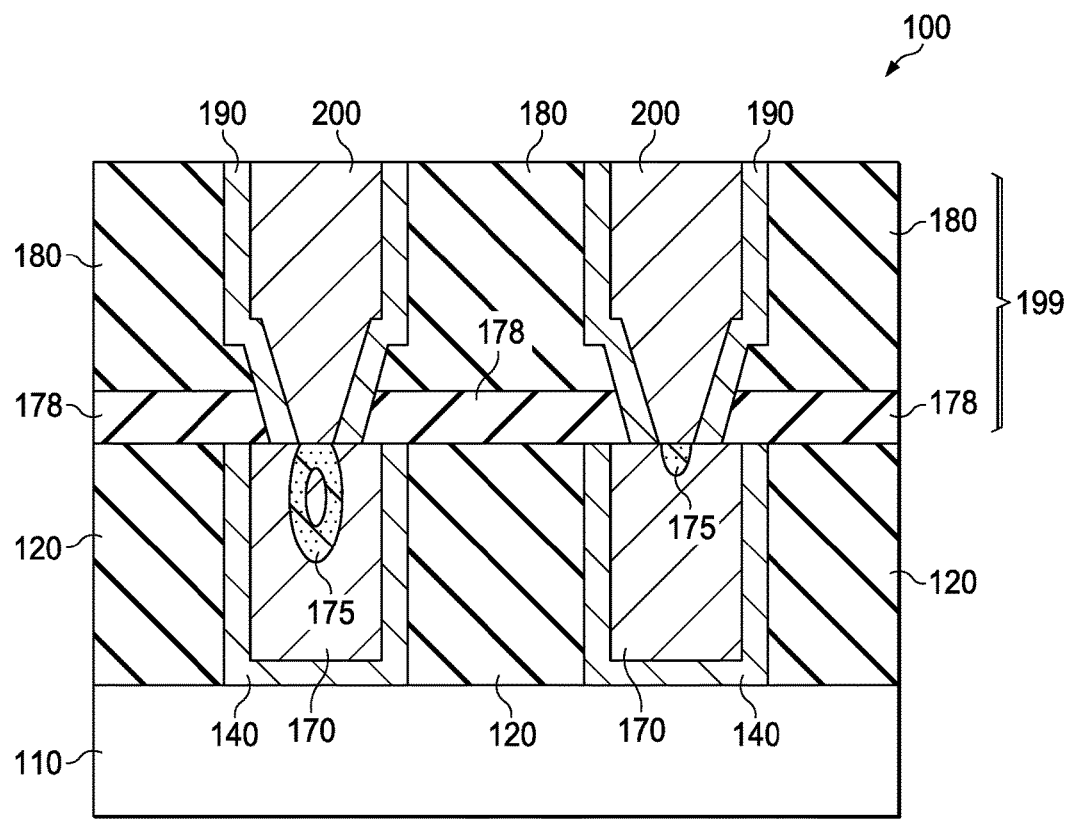

An interconnect feature 199 having second conductive lines 200 embedded in a second dielectric layer 180 is formed over substrate 110, as shown in FIG. 6b. The interconnect feature 199 may be a metal line, a contact, or a metal via. Second conductive lines 200 are aligned with and land on a respective one of the first conductive lines 170 and the sealing metal layer 175 or, in other words the sealing metal layer-filled open void. Particularly, one of the second conductive lines 200 contacts a respective one of the first conductive lines 170 and the sealing metal layer-filled conductive line 170, providing an electrical path. In one embodiment, second conductive lines 200 are formed by patterning the second dielectric layer 180 to form a trench, filling various conductive materials in the trench, and performing a chemical mechanical polishing (CMP) process to remove various conductive materials on the second dielectric layer 180. In one example, patterning the second dielectric layer 180 includes a lithography process and an etching process. The lithography process forms a patterned photoresist layer having an opening that defines a region for the trench. The etching process may include two etch steps to respectively remove the second dielectric layer 180 and an optional etch stop layer 178 within the opening of the patterned photoresist layer. The patterned photoresist layer is removed by wet stripping or plasma ashing after the etching. Alternatively, a hard mask may be used as an etch mask in the process to form the trench.

In some embodiments, a second diffusion barrier layer 190 may be formed between the second dielectric layer 180 and a respective one of the second conductive lines 200. In some embodiments, an etch stop layer 178 may be formed between the interconnect feature 199 and the first dielectric layer 120 and the first sealing metal layer-filled conductive lines 170. The etch stop layer 178 protects the underlying structures, such as first dielectric layer 120, and also provides improved adhesion for subsequently formed layers. The etch stop layer 178 preferably has a dielectric constant of less than about 4.0, and may comprise materials such as SiC, SiCN, SiCO, SiN, carbon-based materials, and combinations thereof. The preferred thickness of the etch stop layer 178 is between about 200 Angstroms and about 1,000 Angstroms.

Figure 7A:
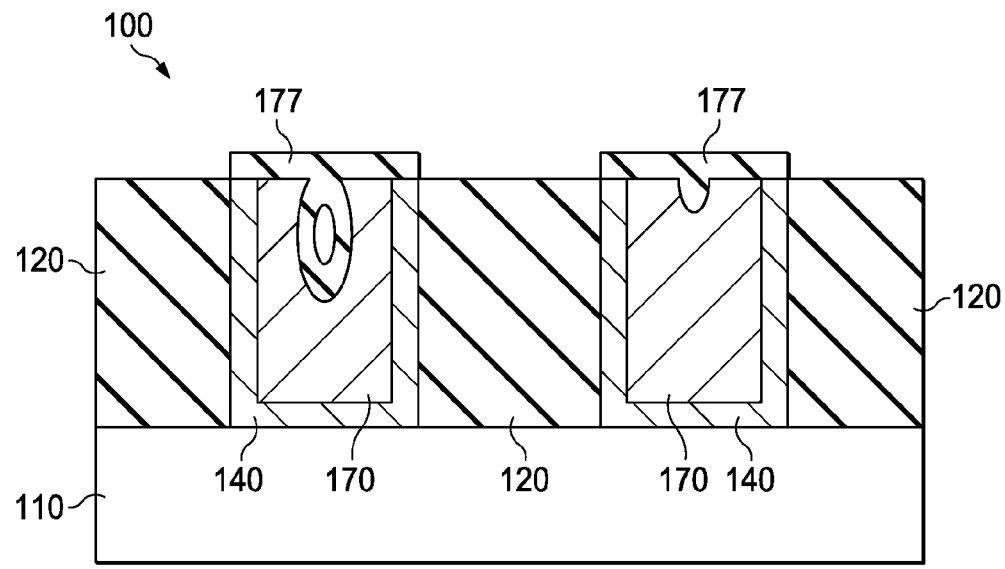
FIGS. 7a-7b are cross-sectional views of a portion of an interconnect structure on a semiconductor device at various stages of fabrication, according to another embodiment of the present disclosure.

FIGS. 2-4 and 7a-7b are cross-sectional views of an interconnect structure on a semiconductor device 100, according to another embodiment of the present disclosure. The process steps for forming the semiconductor device 100 described above with reference to FIGS. 2-4 are the same in this embodiment and therefore will not be repeated again. FIG. 7a illustrates metal caps or sealing metal caps 177 formed on first conductive lines 170. The sealing metal caps 177 preferably comprise materials such as cobalt, nickel, tungsten, molybdenum, silicon, zinc, chrome, boron, phosphorus, nitrogen, and combinations thereof. Sealing metal caps 177 may also be composite layers comprising more than one layer, wherein each of the layers includes one or more of the above-discussed materials. The thickness of the sealing metal caps 177 in an exemplary embodiment is between about 5 Angstroms and about 1,000 Angstroms, and more preferably between about 10 Angstroms and about 100 Angstroms.

In an exemplary embodiment, sealing metal caps 177 are formed by electroless plating and are selectively formed only on exposed surfaces of first conductive lines 170, the sealing metal caps 177 filling the voids 160 in the first conductive lines 170. One advantageous feature of selective formation of sealing metal caps 177 is that top surfaces of sealing metal caps 177 may be deposited higher, level with, or lower, than the respective diffusion barrier layers 140, depending on the design requirements. Electroless plating is preferably performed, for example, by using a plating liquid containing cobalt ions, a complexing agent, a pH buffer, a pH adjusting agent, and an alkylamine borane as a reducing agent. Depending on the preferred composition of sealing metal caps 177, the plating liquid may further contain refractory (high-melting point) metals such as tungsten ions or molybdenum ions. The cobalt ions contained in the plating liquid may be supplied from a cobalt salt, for example, cobalt sulfate, cobalt chloride or cobalt acetate. Other desired components preferred in sealing metal caps 177 are also included in the plating liquid in the form of ions. The structure formed in the previously discussed steps is submerged in the plating liquid, wherein the temperature of the plating liquid is in a range of between about 30 Celsius and about 90 Celsius according to one embodiment.

In the exemplary embodiment shown in FIG. 7a, the sealing metal caps 177 are selectively formed only on the first conductive lines 170 and the first diffusion barrier layers 140, but not on top edges of the first dielectric layer 120. This may be achieved by using a non-palladium catalyst, thus enabling a direct electroless plating. In other embodiments, sealing metal caps 177 can be formed by depositing a metal cap layer using common techniques such as chemical vapor deposition (CVD), plasma-enhanced chemical vapor deposition (PECVD), metal-organic chemical vapor deposition (MOCVD), and atomic layer deposition (ALD), and then etching the metal cap layer to form sealing metal caps 177.

Figure 7B:
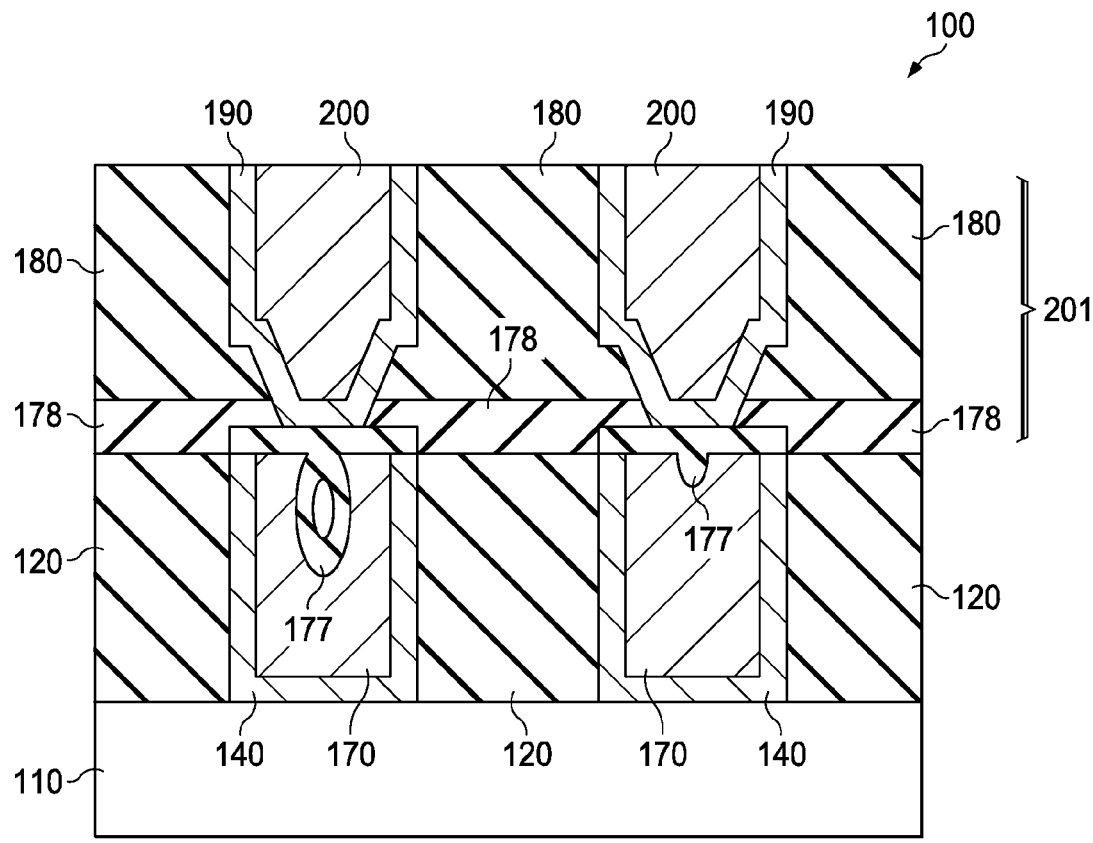

Referring now to FIG. 7b, an interconnect feature 201 having second conductive lines 200 embedded in a second dielectric layer 180 is formed over substrate 110. The interconnect feature 201 may be a metal line, a contact, or a metal via. Second conductive lines 200 are aligned with and land on the sealing metal caps 177 to provide an electrical path. In one embodiment, the second conductive lines 200 are formed by patterning the second dielectric layer 180 to form a trench, filling various conductive materials in the trench, and performing a chemical mechanical polishing (CMP) process to remove various conductive materials on the second dielectric layer 180. In one example, patterning the second dielectric layer 180 includes a lithography process and an etching process. The lithography process forms a patterned photoresist layer having an opening that defines a region for the trench. The etching process may include two etch steps to respectively remove the second dielectric layer 180 within the opening of the patterned photoresist layer. The patterned photoresist layer is removed by wet stripping or plasma ashing after the etching. Alternatively, a hard mask may be used as an etch mask in the process to form the trench.

In some embodiments, a second diffusion bather layer 190 may be formed between the second dielectric layer 180 and a respective one of the second conductive lines 200. In some embodiments, an etch stop layer 178 may be formed between the interconnect feature 201 and the first dielectric layer 120, the sealing metal caps 177, and the first conductive lines 170. The etch stop layer 178 protects the underlying structures, such as first dielectric layer 120, and also provides improved adhesion for subsequently formed layers. The etch stop layer 178 preferably has a dielectric constant of less than about 4.0, and may comprise materials such as SiC, SiCN, SiCO, SiN, carbon-based materials, and combinations thereof. The preferred thickness of the etch stop layer 178 is between about 200 Angstroms and about 1,000 Angstroms.

In the preceding paragraphs, single damascene processes are discussed. One skilled in the art will realize that the teaching is readily available for dual damascene processes.

Advantages of one or more embodiments of the present disclosure provide for a more reliable and robust interconnect structure for advanced semiconductor manufacturing technologies. As voids, seams, or pits in a lower metal line are sealed, a foundation having good electrical and reliability performance is provided for a top metal line or via to land on the lower metal line.

The present disclosure has described various exemplary embodiments. According to one embodiment, a method for forming a semiconductor structure includes providing a semiconductor substrate and forming a dielectric layer over the semiconductor substrate. An opening is formed in the dielectric layer. A conductive line is formed in the opening, wherein the conductive line has an open void formed therein. A sealing metal layer is formed overlying the conductive line, the dielectric layer, and the open void, wherein the sealing metal layer substantially fills the open void. The sealing metal layer is planarized so that a top surface thereof is substantially level with a top surface of the conductive line. An interconnect feature is formed above the semiconductor substrate, wherein the interconnect feature is electrically coupled with the conductive line and the sealing metal layer-filled open void.

According to another embodiment, a method for forming a semiconductor structure includes providing a semiconductor substrate and forming a first dielectric layer over the semiconductor substrate. An opening is formed in the dielectric layer. A conductive line is formed in the opening, wherein the conductive line has an open void formed therein. A sealing metal cap is formed on the first conductive line, the sealing metal cap substantially filling the open void. A second conductive line is formed embedded in a second dielectric layer, the second conductive line electrically contacting the sealing metal cap.

According to yet another embodiment, a semiconductor structure includes a first dielectric layer on a semiconductor substrate, the first dielectric layer having a conductive line with an open void formed therein. The semiconductor structure also includes a sealing metal layer substantially in the open void having a top surface thereof substantially level with a top surface of the conductive line, and an interconnect feature embedded in a second dielectric layer and electrically contacting the conductive line and the sealing metal layer-filled open void.

In the preceding detailed description, specific exemplary embodiments have been described. It will, however, be apparent to a person of ordinary skill in the art that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the claims.

What is claimed is:

1. A semiconductor structure, comprising:
    a first dielectric layer on a semiconductor substrate, the first dielectric layer having a conductive line with an open void formed entirely in an upper half of the conductive line;
    a sealing metal layer substantially filling the open void, the sealing metal layer having a top surface thereof substantially level with a top surface of the conductive line;
    an interconnect feature embedded in a second dielectric layer;
    a diffusion barrier layer interposed between the second dielectric layer and the interconnect feature; and
    wherein the interconnect feature directly contacts the top surface of the sealing metal layer.

2. The semiconductor structure of claim 1, further comprising a diffusion barrier layer interposed between the first dielectric layer and the conductive line.

3. The semiconductor structure of claim 1, wherein a material of the sealing metal layer is selected from the group consisting of cobalt (Co), cupper (Cu), tungsten (W), aluminum (Al), manganese (Mn), ruthenium (Ru), and combinations thereof.

4. The semiconductor structure of claim 1, wherein a material of the sealing metal layer is selected from the group consisting of oxides, nitrides, and combinations thereof.

5. The semiconductor structure of claim 1, wherein the interconnect feature is a metal line.

6. The semiconductor structure of claim 1, further comprising an etch stop layer interposed between the interconnect feature and the second dielectric layer on one side, and the first dielectric layer, the conductive line, and the sealing metal-filled open void on the other side.

7. The semiconductor structure of claim 1, wherein the open void is elliptical in shape.

8. A semiconductor structure comprising:
    a diffusion barrier layer lining a trench in a dielectric layer;
    a metal line filling the trench, wherein a topmost surface of the metal line is substantially coplanar with a topmost surface of the dielectric layer;
    a void region defined in an upper portion of the metal line; and
    a metal sealing cap filling the void region, the metal sealing cap extending above the metal line and a top surface of the dielectric layer, the metal sealing cap having a top surface that is substantially flat.

9. The semiconductor structure of claim 8, wherein the metal line comprises a material selected from the group consisting of copper, copper alloys, aluminum, aluminum alloys, tungsten, gold, silver, and combinations thereof.

10. The semiconductor structure of claim 8, wherein the metal sealing cap comprises a material selected from the group consisting of cobalt, copper, aluminum, tungsten, manganese, ruthenium, and combinations thereof.

11. The semiconductor structure of claim 8, wherein the metal sealing cap comprises a material selected from the group consisting of:
    an oxide of cobalt, copper, aluminum, tungsten, manganese, or ruthenium;
    a nitride of cobalt, copper, aluminum, tungsten, manganese, or ruthenium; and
    combinations thereof.

12. The semiconductor structure of claim 8 wherein the void region is elliptical in shape.

13. The semiconductor structure of claim 8, wherein the void region is extends from a top surface of the metal line down into the metal line.

14. The semiconductor structure of claim 8 further comprising:
    an etch stop layer over the metal sealing cap and the dielectric layer;
    a second dielectric layer over the etch stop layer, the second dielectric layer having a second trench formed therein;
    a second barrier layer lining the second trench; and
    a second metal line filling the second trench, wherein the second metal line directly contacts the metal line.

15. A semiconductor structure comprising:
    a substrate;
    a first dielectric layer on the substrate, the dielectric layer having a trench formed therein;
    a first barrier layer lining the trench;
    a first metal line filling the trench, the first metal line having therein a void extending only partly down the first metal line from a top surface thereof, wherein the top surface of the metal line is substantially coplanar with a top surface of the first dielectric layer;
    a capping layer filling the void and formed over the top surface of the metal line;

an etch stop layer over the first dielectric layer and the capping layer, wherein the capping layer has a topmost surface above a bottommost surface of the etch stop layer;

a second dielectric layer over the etch stop layer, the second dielectric layer having a second trench formed therein, the second trench being aligned with the capping layer;

a second barrier layer lining the second trench; and a second metal line filling the second trench.

16. The semiconductor structure of claim 15, wherein the first metal line comprises copper or a copper alloy.

17. The semiconductor structure of claim 15, wherein the void comprises an oval shaped region extending from a top surface of the first metal line, partly through the first metal line.

18. The semiconductor structure of claim 15, wherein the capping layer comprises a material selected from the group consisting of:
cobalt, copper, aluminum, tungsten, manganese, or ruthenium;
an oxide of cobalt, copper, aluminum, tungsten, manganese, or ruthenium;
a nitride of cobalt, copper, aluminum, tungsten, manganese, or ruthenium; and
combinations thereof.

19. The semiconductor structure of claim 15, wherein the first metal line is a first material and the capping layer is a second material different than the first material.

20. The semiconductor structure of claim 15, wherein the void is a substantially oval shape with an end truncated, the truncated end being planar with a to surface of the first metal line.

* * * * *